United States Patent
Ito et al.

(10) Patent No.: US 9,000,325 B2
(45) Date of Patent: Apr. 7, 2015

(54) ROLLER MOLD MANUFACTURING DEVICE AND MANUFACTURING METHOD

(75) Inventors: Naoto Ito, Tokyo (JP); Toshio Kitada, Tokyo (JP); Hidenari Kiguchiya, Tokyo (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 264 days.

(21) Appl. No.: 13/700,783

(22) PCT Filed: Jun. 8, 2011

(86) PCT No.: PCT/JP2011/063149
§ 371 (c)(1),
(2), (4) Date: Nov. 29, 2012

(87) PCT Pub. No.: WO2011/158714
PCT Pub. Date: Dec. 22, 2011

(65) Prior Publication Data
US 2013/0068734 A1 Mar. 21, 2013

(30) Foreign Application Priority Data
Jun. 16, 2010 (JP) .................... 2010-137226

(51) Int. Cl.
*H01J 37/305* (2006.01)
*B29C 33/38* (2006.01)
(Continued)

(52) U.S. Cl.
CPC .............. *B29C 33/3842* (2013.01); *B23K 15/08* (2013.01); *B29C 33/38* (2013.01);
(Continued)

(58) Field of Classification Search
CPC ....... H01J 37/305; B29C 33/38; B23K 15/00; B23K 15/08
USPC ............... 219/121.18, 121.19, 121.2, 121.31, 219/121.32, 121.35, 121.12
See application file for complete search history.

(56) References Cited

U.S. PATENT DOCUMENTS 5,605,097 A   2/1997   Ruckl et al.
5,781,224 A   7/1998   Ruckl et al.
(Continued)

FOREIGN PATENT DOCUMENTS

JP   1115877 A     1/1996
JP   2009-274347 A   11/2009
(Continued)

OTHER PUBLICATIONS

International Search Report issued in PCT/JP2011/063149, mailed on Aug. 16, 2011.
(Continued)

*Primary Examiner* — Samuel M Heinrich
(74) *Attorney, Agent, or Firm* — Birch, Stewart, Kolasch & Bird, LLP

(57) ABSTRACT

A phenomenon where a depicted pattern becomes unclear owing to a rotational runout of a roller mold in the direction of a rotary shaft is suppressed while restraining an increase in the cost. For the purpose of achieving the above, a roller mold manufacturing device (1) is provided with an electron beam irradiation device (2); a mask (3) which has an opening that allows passage of some of electron beams, and which forms a plurality of beams that perform simultaneous depiction on a resist; a rotation drive device (4) which rotates a roller mold (100) around a rotary shaft (8); a displacement amount detection sensor (5) which detects a rotational runout displacement amount of the roller mold (100) in the direction of the rotary shaft (8); a control device (6); and an actuator (7) which, based on a control signal from the control device (6), allows a depiction position by the electron beams to follow the displacement of the roller mold (100) in the direction of the rotary shaft (8), wherein misalignment of an exposed position of the resist, which is caused by rotational runout displacement of the roller mold (100) in the direction of the rotary shaft (8), is suppressed.

15 Claims, 13 Drawing Sheets

(51) Int. Cl.
  *B23K 15/08* (2006.01)
  *H01J 37/20* (2006.01)
  *H01J 37/317* (2006.01)
  *G03F 1/20* (2012.01)
  *G03F 7/20* (2006.01)
  *G03F 7/24* (2006.01)
  *B82Y 10/00* (2011.01)
  *B82Y 40/00* (2011.01)

(52) U.S. Cl.
  CPC .............. *H01J 37/305* (2013.01); *H01J 37/20* (2013.01); *H01J 37/3174* (2013.01); *H01J 2237/20214* (2013.01); *H01J 2237/2025* (2013.01); *H01J 2237/20271* (2013.01); *H01J 2237/20285* (2013.01); *G03F 1/20* (2013.01); *G03F 7/2037* (2013.01); *G03F 7/24* (2013.01); *B82Y 10/00* (2013.01); *B82Y 40/00* (2013.01)

(56) References Cited

U.S. PATENT DOCUMENTS

2005/0064054 A1\* 3/2005 Kasumi ..................... 425/112
2011/0053088 A1\* 3/2011 Usa et al. ..................... 430/296

FOREIGN PATENT DOCUMENTS

| JP | 2009-288340 A | 12/2009 |
| JP | 2010-156782 A | 7/2010 |
| JP | 2011-118049 A | 6/2011 |

OTHER PUBLICATIONS

Chinese Office Action issued in Chinese Patent Application No. 201180028829.7 on May 4, 2014.

\* cited by examiner

FIG. 9
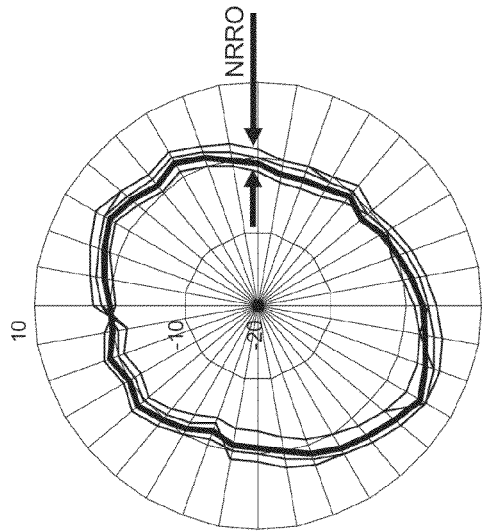
(B) NRRO···NON ROTATION SYNCHRONOUS RUNOUT IDEAL LOCUS
NRRO: Non Repetitive Run Out
—— RRO
---- NRRO
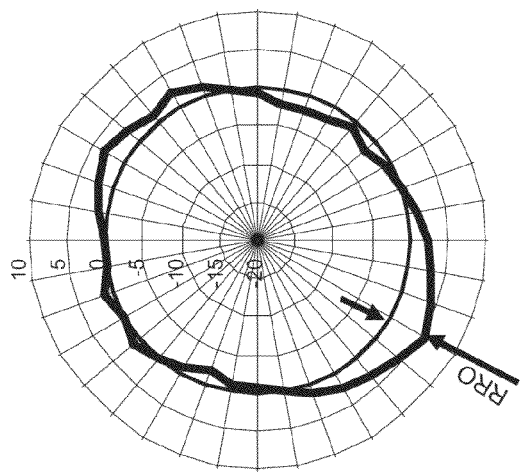
(A)
RRO: Repetitive Run Out
ROTATION SYNCHRONOUS RUNOUT
PRO SAME LOCUS (ONE LOCUS) FOR EACH ROTATION

US 9,000,325 B2

ROLLER MOLD MANUFACTURING DEVICE AND MANUFACTURING METHOD

TECHNICAL FIELD

The present invention relates to a roller mold manufacturing device and a manufacturing method. More particularly, the present invention relates to improvement of a technology to enhance precision of depiction onto a roller mold.

BACKGROUND ART

Heretofore, characteristics of an optical device such as an LED or an LD have been controlled or improved by forming a periodic structure of a light wavelength degree on the surface of the optical device or in the device. The periodic structure for such a purpose is formed by various types of fine processing, and one of such technologies considered to be most dominant at present is a nanoimprint technology. A mold (the die) for use in nanoimprint die transfer is usually prepared by an optical exposure device.

Here, as the mold for use in the die transfer, there are developed a flat plate-like mold for use in flat plate pressing, and additionally a roller-like mold (the roller mold) which enables continuous transfer to a film while rotating. Heretofore, the roller mold has been prepared by attaching a flexible material such as a metal thin film to a roller, but in this case, there is a cut in the mold to which the material is attached. Therefore, when the roller rotates one revolution, a joint sometimes remains in the pattern. In this respect, according to a technique of exposing and depicting a pattern while rotating the roller mold, such a problem can be avoided.

Meanwhile, during the exposing while rotating the roller mold, heretofore, there has been performed a depiction technique (see FIG. 5) in which electron beams are focused on a lens and a resist is irradiated with the beams. Additionally, there is also suggested a simultaneous depiction technique (see FIG. 6) in which a stencil mask provided with an opening pattern is irradiated with electron beams formed into substantially parallel beams by a lens, and a resist is irradiated with the plurality of passed electron beams (see e.g., Patent Document 1). In the former case, when the electron beams are focused, an output at the focused position can be enhanced, which enables predetermined depiction on the resist at one irradiation time (one-rotation depiction). However, a region where the depiction is possible at a time is small, and hence a certain degree of time is required to depict the whole desirable pattern (throughput is small). On the other hand, in the latter case, a broad region is irradiated with the electron beams, and hence it is possible to increase the throughput. However, in the latter case, since the beams are not focused but are emitted, the output at each irradiation position is not high. In consequence, by multi-rotation depiction in which a groove-like pattern (see FIG. 7 and FIG. 8) is gradually deeply formed while rotating the roller mold many times, depiction performed through rotation at a low speed although the number of the rotation times is small (additionally, such a mold pattern is also called line and space owing to the configuration. See FIG. 7), or the like, it is necessary to lengthen a beam irradiation time of a depiction object area to a certain degree.

PRIOR ART DOCUMENT

Patent Document

Patent Document 1: JP 2009-274347 A

SUMMARY OF THE INVENTION

Problem to be Solved by the Invention

However, when a general purpose bearing is used during exposure while rotating a roller mold, runout which is not synchronized with the rotation of a roller occurs in a vertical direction to the rotation of the roller (i.e., the rotary shaft direction), misalignment occurs at relative positions of the roller and a mask sometimes. In this case, a pattern depicted on the roller mold disadvantageously becomes unclear (see a two-dots chain line in FIG. 8).

Therefore, an object of the present invention is to provide a roller mold manufacturing device in which a phenomenon where a depicted pattern becomes unclear owing to rotational runout of a roller mold in the direction of a rotary shaft can be suppressed while restraining an increase in the cost, and a manufacturing method.

Means for Solving the Problem

To achieve such an object, the present inventors have performed various investigations. First, two types of rotational runouts which cause a rotational runout phenomenon of a roller mold in the direction of a rotary shaft, i.e., Repetitive Run Out (RRO) and Non Repetitive Run Out (NRRO) have been noted and investigated. Both of rotation cycle runout (the RRO) and non rotation cycle runout (the NRRO) are runouts which are caused by a precision error in the rotary shaft or a bearing, or the like and which are unique to a mechanism to rotate the roller mold. Additionally, the RRO is a component of the runout which corresponds to a rotation angle (the rotation cycle) of the roller mold, and a similar locus is drawn for each rotation (see FIG. 9(A)), whereas the non rotation cycle runout (the NRRO) is a component of the runout which does not correspond to the rotation angle (the rotation cycle), and the locus becomes different for each rotation (see FIG. 9(B)). Therefore, for the purpose of suppressing a phenomenon where a pattern depicted on the roller mold becomes unclear, it is important how to eliminate an influence of the rotational runout due to the non rotation cycle runout (the NRRO) which it is difficult to predict.

The inventors, who have further investigated such a non rotation cycle runout (the NRRO), also have focused attention on an aerostatic pressure (or a kinetic pressure) bearing. The aerostatic pressure bearing is a plain bearing of a structure in which air is supplied to a flange of an air spindle, or the like to float a shaft, and the NRRO is minimal owing to the characteristic structure (see FIG. 10). However, in the aerostatic pressure bearing, a withstand load has to be low owing to the structure in which the shaft is floated by the pressure of the supplied air. Therefore, when the aerostatic pressure bearing is applied to the roller mold having a large roll surface length (the length of the roller mold in an axial direction), the noticeable enlargement of the bearing is incurred. This results in the noticeable enlargement of the whole roller mold manufacturing device and a cost increase, and it is difficult to employ the bearing.

The present inventors, who have further repeated investigations on how to eliminate the influence of the rotational runout based on the above-mentioned investigation results, have obtained findings which are interconnected to the solution of the problems. The present invention has been developed based on such findings, and a manufacturing device of a roller mold which is a roller-like die to transfer a pattern includes an electron beam irradiation device which irradiates, with electron beams, the roller mold coated with a resist; a mask which has an opening that allows passage of some of electron beams emitted from the electron beam irradiation device, and which forms a plurality of electron beams that perform simultaneous depiction on the resist; a rotation drive device which rotates the roller mold around a rotary shaft; a displacement amount detection sensor which detects the rotational runout displacement amount of the roller mold in the direction of the rotary shaft at the rotation by the rotation drive device; a control device which receives a detection signal from the displacement amount detection sensor, and transmits a control signal to allow a depiction position on the resist of the roller mold by the electron beams to follow the roller mold; and an actuator which, based on the control signal from the control device, allows the depiction position by the electron beams to follow the displacement of the roller mold in the direction of the rotary shaft. The roller mold manufacturing device suppresses misalignment of an exposed position of the resist which is caused by rotational runout displacement of the roller mold in the direction of the rotary shaft.

In such a roller mold manufacturing device, when the rotational runout of the roller mold in the rotary shaft direction occurs, the displacement amount detection sensor detects the displacement amount (the axial displacement amount) of the roller mold in the rotary shaft direction, and transmits the amount to the control device. The control device which has received the detection signal transmits a feedback signal to the actuator. The actuator which has received this feedback signal allows the depiction position by the electron beams to follow the roller mold, to suppress the misalignment of the exposed position of the resist which is caused by the rotational runout displacement. Consequently, it is possible to suppress a phenomenon where a depicted pattern becomes unclear owing to the rotational runout of the roller mold in the rotary shaft direction. Additionally, unlike a case where an aerostatic pressure bearing in which NRRO is minimal is used, a cost increase is not incurred.

In such a roller mold manufacturing device, the opening of the mask is preferably an opening which forms the passed electron beams into a plurality of parallel beams.

Moreover, the actuator in the roller mold manufacturing device is, for example, an actuator which moves the mask in the rotary shaft direction.

The displacement amount detection sensor preferably detects the displacement amount of an end surface of the rotary shaft in the rotary shaft direction. In this case, the displacement amount detection sensor more preferably detects the displacement amount of a rotation center portion of the end surface of the rotary shaft.

The actuator is preferably a piezoelectric actuator.

Moreover, according to the present invention, a method of manufacturing a roller mold which is a roller-like die to transfer a pattern includes allowing passage of electron beams emitted from an electron beam irradiation device through a mask provided with an opening to form a plurality of beams which perform simultaneous depiction on a resist; rotating the roller mold coated with the resist around a rotary shaft, and irradiating the roller mold with the electron beams passed through the mask; detecting a rotational runout displacement amount of the roller mold in the direction of the rotary shaft at the rotation; and allowing a depiction position on the resist of the roller mold by the electron beams to follow the roller mold based on the detection signal.

In such a manufacturing method, the electron beams passed through the opening of the mask are preferably formed into a plurality of parallel beams.

Moreover, an actuator preferably moves the mask in the rotary shaft direction, and allows the depiction position on the resist of the roller mold by the electron beams to follow the roller mold.

Furthermore, in such a manufacturing method, a displacement amount of an end surface of the rotary shaft in the rotary shaft direction is preferably detected to detect the rotational runout displacement amount of the roller mold in the rotary shaft direction. In this case, a displacement amount of a rotation center portion of the end surface of the rotary shaft is more preferably detected.

Additionally, the roller mold manufacturing device preferably further includes an absolute system treatable as a system which is not influenced by a temperature change; a mask position measurement sensor which measures a position of the mask by use of the absolute system as a reference; and a roller mold position measurement sensor which measures a position of the roller mold by use of the absolute system as a reference. The control device preferably receives measurement signals from the roller mold position measurement sensor and the mask position measurement sensor, and transmits a control signal to minimize misalignment of the depicted pattern on the resist of the roller mold by the electron beams, and the actuator moves at least one of the roller mold and the mask based on the control signal from the control device, and moves the depiction position by the electron beams.

Moreover, the roller mold manufacturing method preferably further includes measuring a position of the roller mold by use of an absolute system treatable as a system which is not influenced by a temperature change, as a reference; measuring a position of the mask by use of the absolute system as a reference; detecting a relative misalignment amount based on a difference between the position of the roller mold or the position of the mask and the absolute system, when a relative position misalignment between the roller mold and the mask occurs; and moving at least one of the roller mold and the mask to minimize the misalignment of the depicted pattern on the resist of the roller mold by the electron beams.

Furthermore, in the present invention, a manufacturing method of a roller mold which is a roller-like die to transfer a pattern includes measuring a position of the roller mold by use of an absolute system treatable as a system which is not influenced by a temperature change, as a reference; measuring a position of a mask which allows passage of some of electron beams emitted from an electron beam irradiation device, further by use of the absolute system as a reference; detecting a relative misalignment amount based on a difference between the position of the roller mold or the position of the mask and the absolute system, when a relative position misalignment between the roller mold and the mask occurs; and moving at least one of the roller mold and the mask to minimize the misalignment of a depiction position on the resist of the roller mold by the electron beams.

Additionally, in the present invention, a manufacturing device of a roller mold which is a roller-like die to transfer a pattern includes an electron beam irradiation device which irradiates the roller mold coated with a resist with electron beams; a mask which has an opening that allows passage of some of the electron beams emitted from the electron beam irradiation device, and which forms a plurality of beams that perform simultaneous depiction on the resist; a roller support jig which supports the roller mold; a rotation drive device which rotates the roller mold around a rotary shaft; an absolute system treatable as a system which is not influenced by a temperature change; a mask position measurement sensor which measures a position of the mask by use of the absolute system as a reference; a roller mold position measurement sensor which measures a position of the roller mold by use of the absolute system as a reference; a control device which receives measurement signals from the roller mold position measurement sensor and the mask position measurement sensor, and which transmits a control signal to minimize misalignment of a depiction position on the resist of the roller mold by the electron beams; and an actuator which moves at least one of the roller mold and the mask based on the control signal from the control device, and moves the depiction position by the electron beams.

When, for example, the relative misalignment amounts of the roller mold and the mask in a case where the temperature changes can directly be detected, the detection is simple and requires less labor, but in actual, detection means itself might cause the position misalignment under the influence of the temperature change. In this respect, according to the present invention, the absolute system which is remarkably hardly influenced by the temperature change is set, and the relative position misalignment of the roller mold or the like is measured by use of this absolute system as the reference. The measured position misalignment amount is measured as the amount in the absolute system, and hence when a difference between these amounts is calculated, the misalignment amounts of the mask and the roller mold can constantly accurately be detected. Based on this detection result, correction is performed so as to minimize the misalignment of the relative positions of the mask and the roller mold, and the depicted pattern can be prevented from becoming unclear.

Effect of the Invention

According to the present invention, it is possible to suppress a phenomenon where a depicted pattern becomes unclear owing to rotational runout of a roller mold in the direction or a rotary shaft, while restraining an increase in the cost.

BRIEF DESCRIPTION OF THE DRAWINGS

FIG. 9 are diagrams explaining two types of rotational runouts which cause a rotational runout phenomenon of the roller mold in a rotary shaft direction, and showing the runouts of (A) rotation cycle runout (the RRO) and (B) non rotation cycle runout (the NRRO) corresponding to rotation angles (rotation cycles), respectively;

MODE FOR CARRYING OUT THE INVENTION

Figure 1:
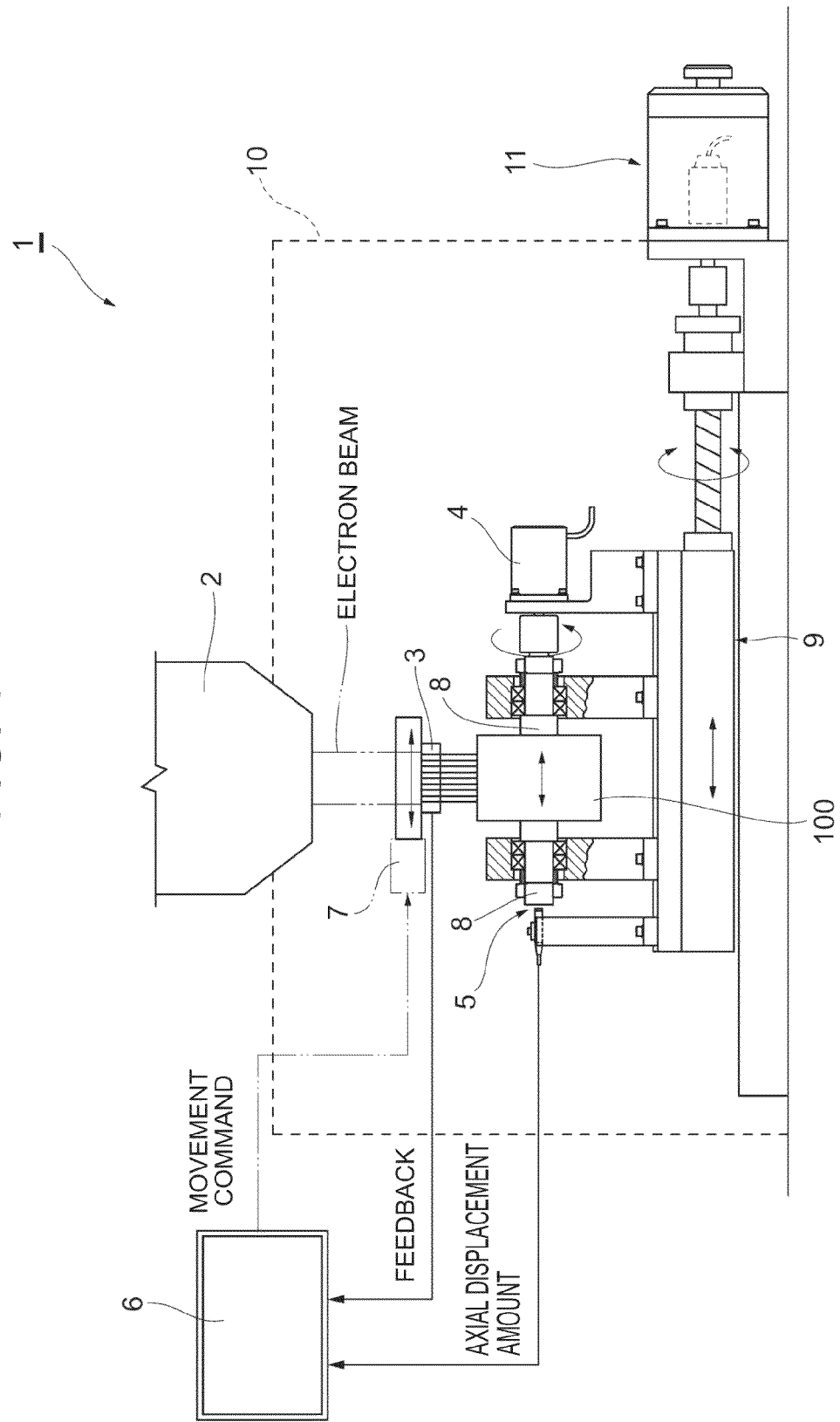
FIG. 1 is a view showing a constitution of a roller mold manufacturing device in an embodiment of the present invention.

Hereinafter, a constitution of the present invention will be described in detail based on one example of a mode for carrying out the invention shown in the drawings.

First Embodiment

FIG. 1 and the like show a roller mold manufacturing device and a manufacturing method according to the present invention. A roller mold manufacturing device 1 according to the present invention is a manufacturing device of a roller mold 100 which is a roller-like die to transfer a pattern, and includes an electron beam irradiation device 2, a stencil mask 3, a rotation driving motor (the rotation drive device) 4, a displacement amount detection sensor 5, a control device 6, an actuator 7, a rotary shaft 8, a stage 9, a sample chamber 10, a shaft movement motor 11 and the like. The roller mold manufacturing device 1 irradiates the stencil mask 3 with electron beams, and irradiates a resist which coats the cylindrical roller mold 100 with the electron beams passed through an opening pattern formed on the stencil mask 3, to perform exposure.

The roller mold 100 which is a manufacturing object is a roller-like mold which enables continuous transfer to a film while rotating. The roller mold 100 of the present embodiment is a cylindrically formed mold, and is attached to the rotary shaft 8 of the roller mold manufacturing device 1. The surface of the roller mold 100 is evenly coated with a resin (the resist) which is photosensitive to the electron beams.

The electron beam irradiation device 2 irradiates, with the electron beams, the roller mold 100 coated with the resist. The stencil mask 3 disposed closely to the roller mold 100 is irradiated from an upper part to a lower part thereof with the electron beams in the present embodiment.

The stencil mask 3 allows passage of some of the electron beams emitted from the electron beam irradiation device 2, and forms a plurality of beams which perform simultaneous depiction on the resist. In this stencil mask 3, a micro pattern which allows the passage of the electron beams only through an opening is formed. The stencil mask itself has at least a thickness to such an extent that the electron beams are not passed, and the opening pattern which partially allows the passage of the electron beams is processed in the even film having a predetermined area. The stencil mask 3 is disposed at a position close to the surface of the roller mold 100.

Moreover, although not especially shown in the drawing in detail, in the present embodiment, the stencil mask 3 is disposed to be movable in the rotary shaft direction, for example, by the guiding of the mask with a linear guide, or the like (see FIG. 1). The stencil mask 3 receives a force from the actuator 7 to move in an axial direction. Although not especially shown in the drawing, a position or displacement of the stencil mask 3 is detected by, for example, a capacitance type displacement meter or the like, and fed back to the control device 6 (see FIG. 1).

The rotation driving motor (the rotation drive device) 4 rotates the roller mold 100 around the rotary shaft at a pitch of a predetermined rotation angle. The pitch of the predetermined rotation angle can be detected by, for example, an encoder connected to the rotation driving motor 4.

The displacement amount detection sensor 5 is a sensor which detects a rotational runout displacement amount (the axial displacement amount) of the roller mold 100 in the rotary shaft direction at the rotation of the roller mold 100. For example, in the present embodiment, the axial displacement amount of the end surface of the rotary shaft 8 to which the roller mold 100 is attached is detected, and the detected value is used as the axial displacement amount of the roller mold 100.

Figure 3:
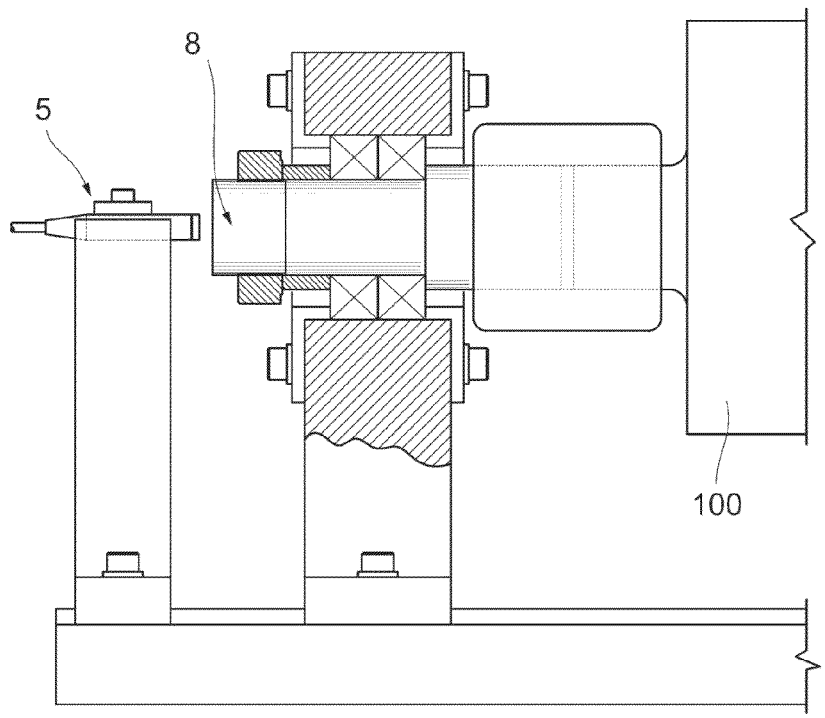
FIG. 3 is a partially enlarged view of the roller mold manufacturing device showing one example of a disposing configuration of a displacement amount detection sensor.
Figure 4:
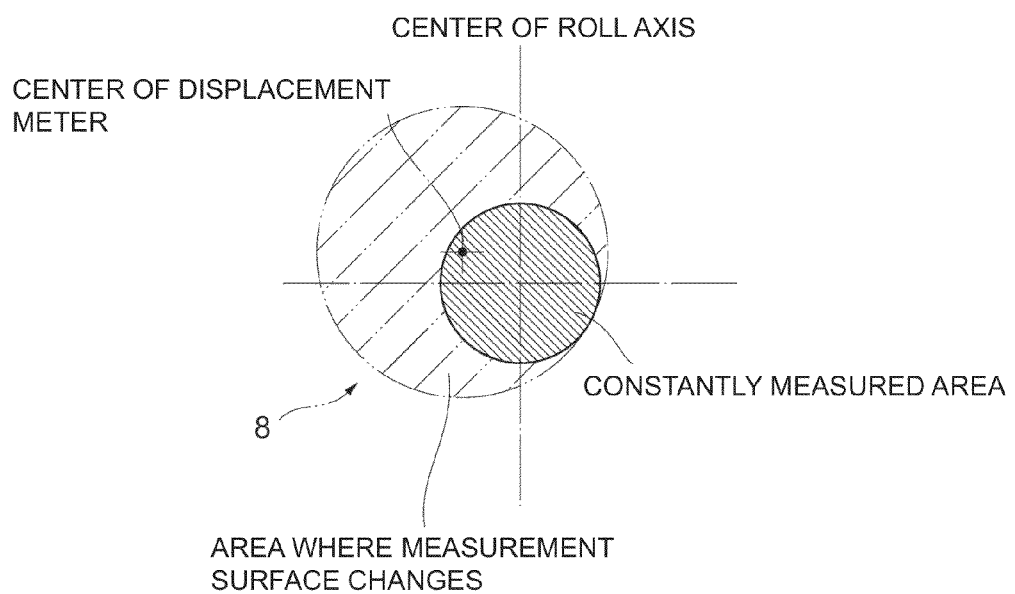
FIG. 4 is a diagram showing a measurement model in an end surface of a rotary shaft which is a detection object example of the displacement amount detection sensor.
Figure 5:
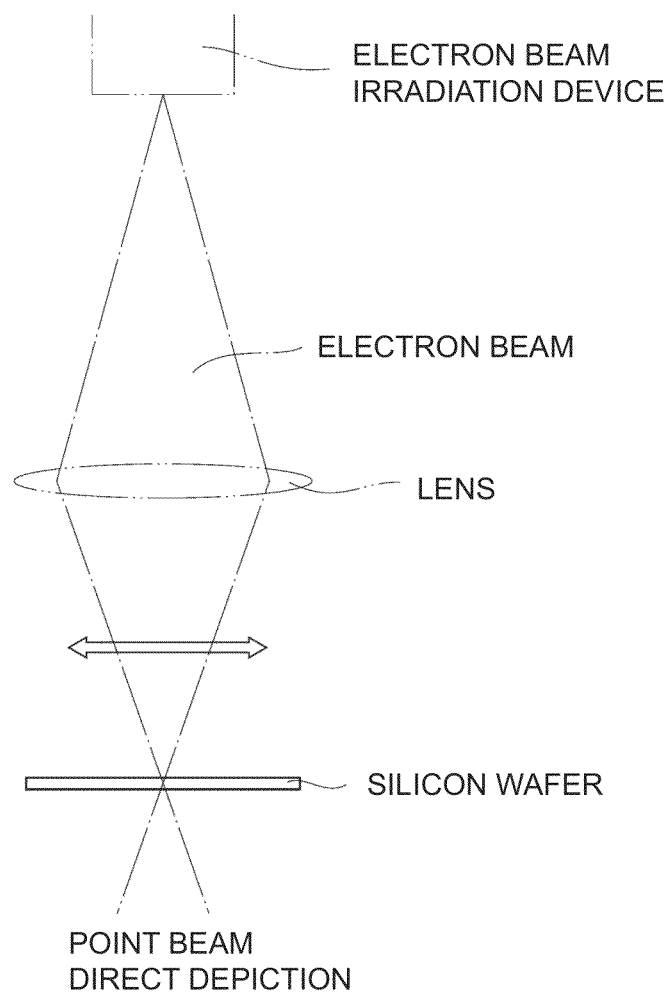
FIG. 5 is a reference diagram showing that electron beams are focused by a lens to irradiate a resist and perform depiction, when the roller mold is exposed.

As the displacement amount detection sensor 5, it is possible to use the capacitance type displacement meter (a type of a micro displacement sensor, to which the principle of a capacitor is applied, measures the displacement by use of the capacitance which changes in inverse proportion to a distance between electrodes) or the like (see FIG. 3). In the capacitance type displacement meter, a spot diameter is preferably comparatively large (the measurement object area is comparatively large).

Moreover, when the end surface of the rotary shaft 8 is measured to detect the axial displacement as described above, the detection preferably is not influenced by surface roughness of the end surface. In the present embodiment, a displacement amount of a rotation center portion of the end surface of the rotary shaft 8 is detected to limit a region which is a detection object, whereby the detection is prevented from being influenced by the surface roughness. A specific example will be described. In the present embodiment, the influence of the surface roughness is suppressed as much as possible by a measurement model in which an area around an axis is a constantly measured area, not by a measurement model in which facing measurement surfaces are constantly changing areas.

The control device 6 receives a detection signal (the axial displacement amount) from the displacement amount detection sensor 5, and transmits a control signal which allows a depiction position on the resist of the roller mold 100 by the electron beams to follow the roller mold 100. On receiving the signal of the axial displacement amount from the displacement amount detection sensor 5, the control device 6 of the present embodiment transmits the control signal (the movement command) to the actuator 7 to move the stencil mask 3 in the axial direction. As a method of transmitting the control signal, there is a method of transmitting the detected displacement amount as it is or a method of transmitting a result of an operation such as PID control.

The actuator 7 allows the depiction position by the electron beams to follow the displacement of the roller mold 100 in the rotary shaft direction based on the control signal from the control device 6. When the depiction position by the electron beams is moved to follow the displacement of the roller mold 100, it is possible to simultaneously move both the electron beam irradiation device 2 and the stencil mask 3 as much as the same amount, but from the viewpoint of enhancing a response, the only stencil mask 3 which is light weight as compared with the electron beam irradiation device 2 is preferably moved. As described above, in the present embodiment, the roller mold 100 is irradiated with the electron beams emitted to the stencil mask 3 and passed through the opening pattern. Therefore, even when the electron beam irradiation device 2 is not moved, the depiction position by the electron beams can be moved and changed by moving the stencil mask 3 (see FIG. 1).

In the present embodiment, as the actuator 7, a piezoelectric actuator (the piezo actuator) including a piezoelectric element (the piezo element) is used. The piezoelectric actuator has more excellent response than any other actuator, and hence when the roller mold 100 is displaced in the rotary shaft direction, the depiction position by the electron beams can be allowed to quickly follow the displacement synchronously with the displacement.

On the stage 9, the roller mold 100 is mounted in a rotatable state, and the stage precisely moves the roller mold 100 in the rotary shaft direction. The stage 9 is disposed to be slidable by, for example, a linear guide, and moves as much as a predetermined amount in the rotary shaft direction of the roller mold 100 in accordance with a rotating direction and a rotation amount of the shaft movement motor 11. The movement amount of the stage 9 can be measured by, for example, a laser interferometer (omitted from the drawings).

In the sample chamber 10, a vacuum state is held. The stencil mask 3, the rotation driving motor 4 and the like are contained in the sample chamber 10 (see FIG. 1).

Figure 2:
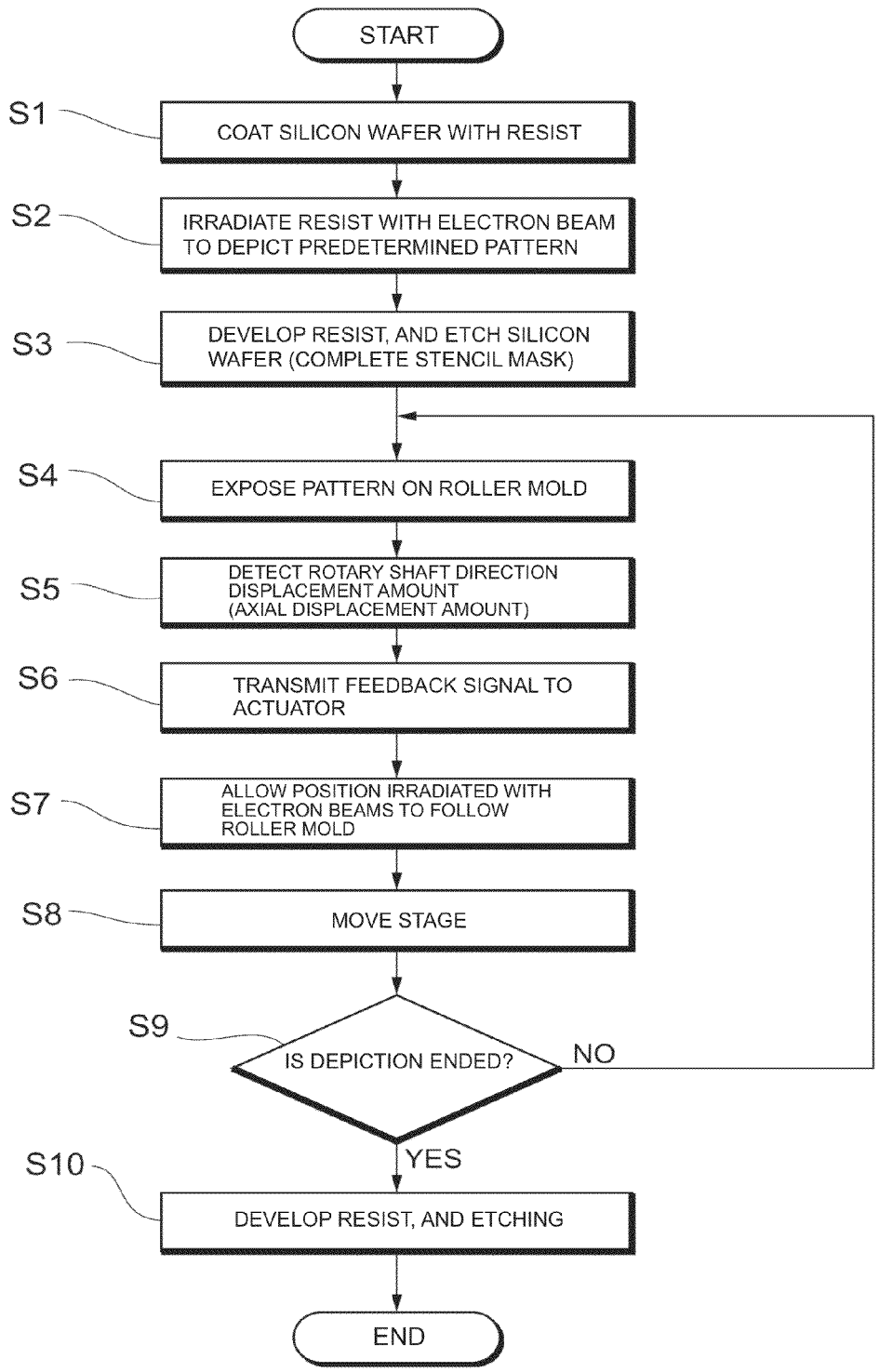
FIG. 2 is a flowchart showing one example of a manufacturing method of a roller mold.

Hereinafter, one example of a roller mold manufacturing method using the roller mold manufacturing device 1 will be described (see FIG. 2, etc.).

First, a silicon wafer is coated with the resist (step SP1). For example, by dropping a resist liquid to the center of the silicon wafer and spreading the liquid with a centrifugal force while the silicon wafer is rotated at a high speed, the silicon wafer can evenly be coated with the resist. After coating the silicon wafer with the resist and drying the resist in this manner, the resist is irradiated with the electron beams to depict a predetermined pattern (step SP2). Afterward, the development of the resist and the etching of the silicon wafer are performed, to obtain the silicon wafer (i.e., the stencil mask 3) in which a hole is made in a pattern portion (or a portion other than the pattern) (step SP3). For example, in the present embodiment, the silicon wafer is used as a material, and a required area to prepare the pattern is processed into a thin film of about 0.001 mm. Then, the required opening pattern is prepared in this area, to form a pattern through which the electron beams pass.

Moreover, when the roller mold 100 is irradiated with the electron beams while rotating the mold, the rotational runout of the roller mold 100 in the rotary shaft 8 direction is detected by the displacement amount detection sensor 5 (step SP5), and transmitted to the control device 6. The control device 6 which has received the detection signal transmits a feedback signal to the actuator 7 (step SP6). The actuator 7 which has received this feedback signal allows the depiction position by the electron beams to follow the roller mold 100, and suppresses misalignment of an exposed position of the resist which is caused by the rotational runout displacement (step SP7).

Figure 6:
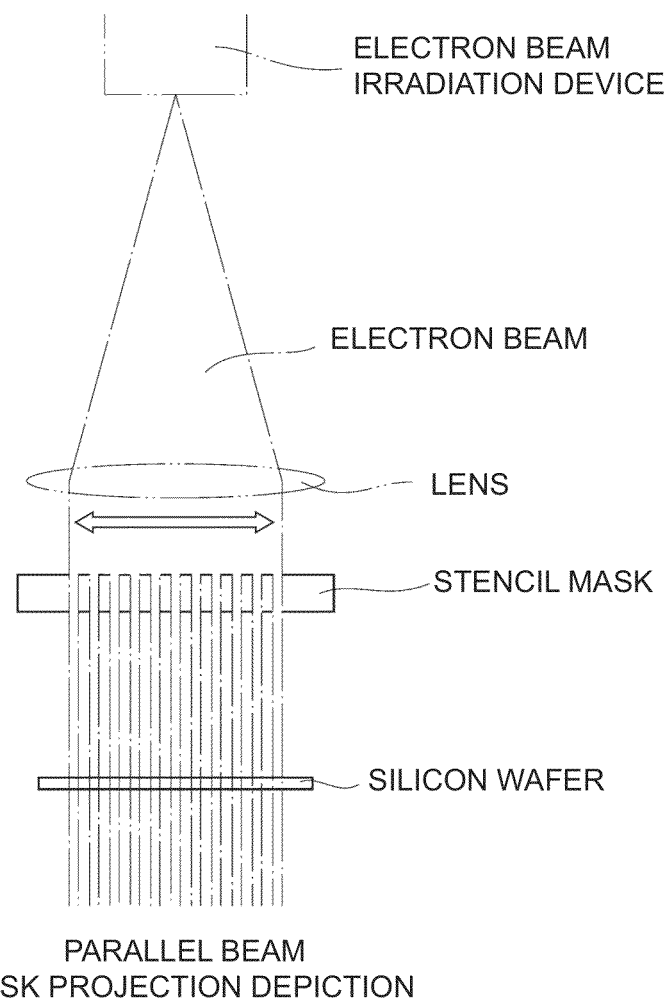
FIG. 6 is a diagram showing that a stencil mask provided with an opening pattern is irradiated with the electron beams formed into substantially parallel beams by the lens and that the resist is irradiated with a plurality of passed electron beams to perform simultaneous depiction, when the roller mold is exposed.
Figure 7:
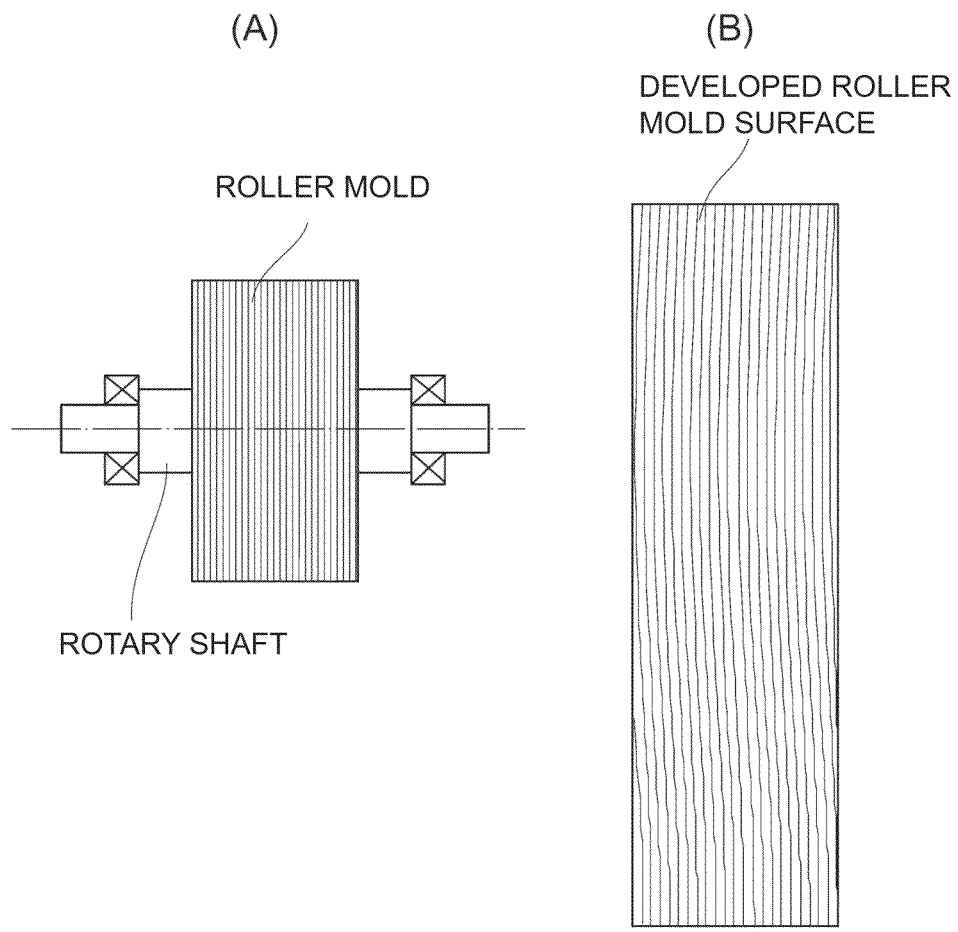
FIG. 7 shows an example of a pattern formed on the roller mold, (A) is the whole view of the roller mold on a rotary shaft, and (B) is a development of the surface of the roller mold.
Figure 8:
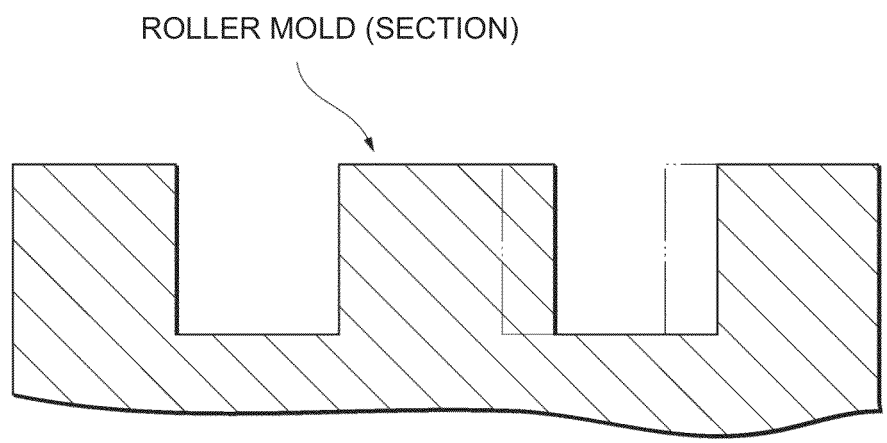
FIG. 8 is an enlarged sectional view showing one example of a groove-like pattern formed in the roller mold.
Figure 10:
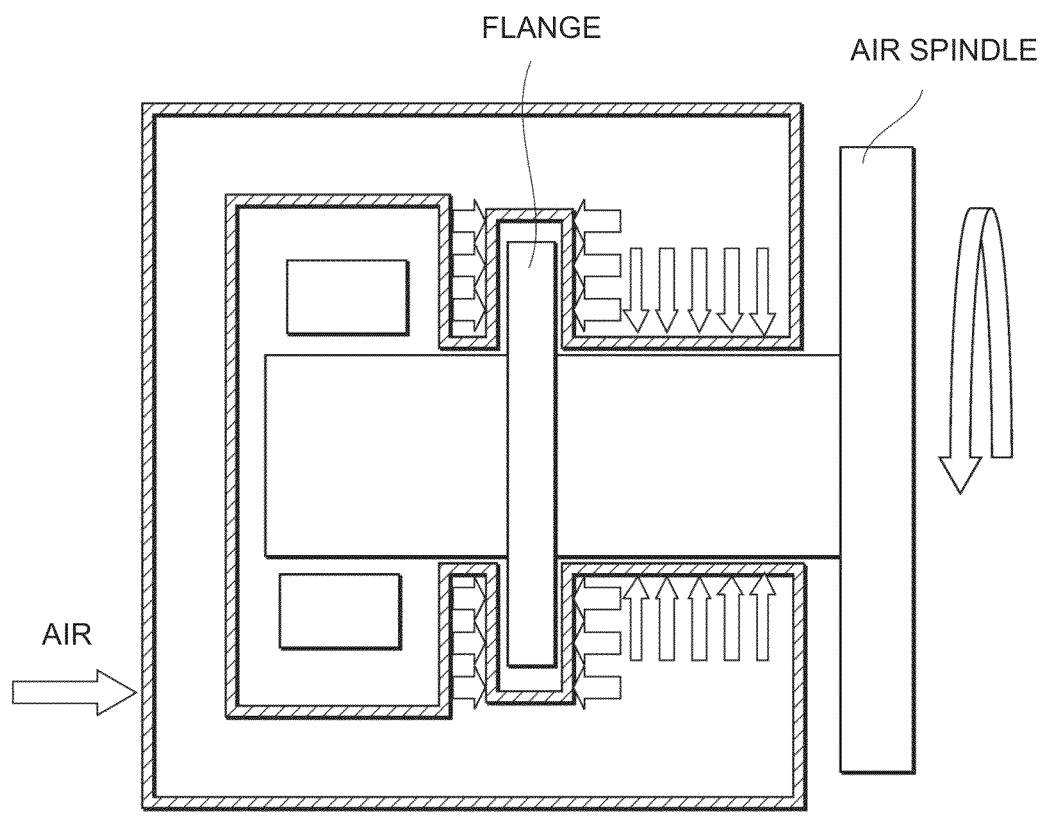
FIG. 10 is a view showing a structure example of an aerostatic pressure bearing as a reference.

Here, in the present embodiment, the stencil mask 3 is irradiated with the electron beams formed into substantially parallel beams by a lens (the condensing lens or the like), and the resist is irradiated with a plurality of electron beams passed through the opening pattern to perform simultaneous depiction (see FIG. 1 and FIG. 6). In such a case, a broader region can be irradiated with the electron beams than in a case where focused beams are used, and hence it is possible to enhance throughput. However, each irradiated portion is irradiated with the beams which are not focused, an output in the portion is not high, and accordingly, it is necessary to lengthen irradiation time. Additionally, when a predetermined irradiation time can be achieved in each portion, the rotation speed of the roller mold 100 (and the rotary shaft 8) may be higher or lower (the throughput is not influenced by the rotation speed).

When the depiction is performed on the predetermined region of the roller mold 100, the shaft movement motor 11 is driven to move the stage 9 as much as a predetermined amount (step SP8), and when the depiction on the predetermined region does not end (NO in step SP9), the next depiction region is irradiated with the electron beams to perform the depiction (step SP4). Afterward, when the moving of the stage 9, the irradiating with the electron beams and the depiction are repeated to end the depiction on the predetermined region of the resist (YES in the step SP9), the development of the resist and the etching are performed (step SP10), and the resist is removed, to end the manufacturing of the roller mold 100.

As described up here, in the roller mold manufacturing device 1 of the present embodiment, the depiction position by the electron beams are allowed to follow the axial direction displacement (the axial displacement) of the roller mold 100 synchronously with the displacement. Therefore, it is possible to suppress the misalignment of the exposed position which is caused by the rotational runout displacement of the roller mold 100. In consequence, a phenomenon where the depicted pattern becomes unclear owing to the rotational runout of the roller mold 100 in the rotary shaft direction can be suppressed. In addition, unlike a case where an aerostatic pressure bearing is used, enlargement or cost increase is not incurred.

Moreover, when the misalignment of the exposed position of the resist occurs on the roller mold 100, the roller mold 100 itself is moved in the axial direction as needed to prevent the position misalignment, which can be one means. However, in contrast, in the roller mold manufacturing device 1 of the present embodiment, the roller mold 100 is not moved, but the only stencil mask 3 that is lighter than this mold is moved to follow, so that a synchronous operation having excellent response and followability can be realized. In particular, the larger the surface length of the roller mold 100 becomes, the more the weight necessarily increases. In contrast, the size and weight of the stencil mask 3 are predetermined irrespective of the roller surface length. Therefore, the larger the surface length of the roller mold 100 is, the more noticeable the effect becomes.

It is to be noted that the above embodiment is one example of a preferable mode for carrying out the present invention, but the present invention is not limited to this embodiment, and can variously be modified without departing from the scope of the present invention. For example, in the present embodiment, the stencil mask 3 is irradiated with the electron beams formed into the parallel beams by the lens, but the parallel mentioned herein can include not only the completely parallel state but also other states (e.g., a state where the beams are slowly focused). In short, in the present embodiment, the plurality of electron beams passed through the stencil mask 3 are used to perform the simultaneous depiction on a certain area of the resist, which is one characteristic. Even when the plurality of electron beams are not completely parallel, it is possible to perform the simultaneous depiction on the resist. From this viewpoint, the plurality of applicable electron beams are not limited to the completely parallel beams.

Moreover, in the present embodiment, the actuator 7 is operated to move the stencil mask 3 in the axial direction, but this is also a preferable example, and the present invention is not limited to this configuration. In short, when the depiction position (the exposed position) on the resist of the roller mold 100 by the electron beams is changed, it is possible to suppress the misalignment of the exposed position of the resist which is caused by the rotational runout displacement of the roller mold 100 in the rotary shaft direction. As long as this is achieved, for example, the roller mold 100 itself may be moved in the rotary shaft direction as described above, or the electron beam irradiation device 2 and the stencil mask 3 may be moved in the rotary shaft direction.

Second Embodiment

In the present embodiment, in a roller mold manufacturing device 1, there is built a system (also called the absolute system in the present description) in which an influence of displacement due to a temperature change or the like is treatable as zero (0). There is not any special restriction on a specific example of the absolute system. However, for example, in the present embodiment, a stage 21 is formed by using a ceramics material (new ceramics as one example) which is a material of a very low coefficient of linear expansion (the linear expansion coefficient nearly equals 0 ppm), and at a predetermined position of the stage 21, there is built the absolute system in which the displacement due to the temperature change is treatable as 0 (the influence of a minor temperature change at ordinary temperature is 0) or ignorable (see a dot part of FIG. 11). In such an absolute system, even when the relative position misalignment caused by the minor temperature change at ordinary temperature occurs in any of a roller mold 100, a roller support jig (including a rotary shaft 8, a bearing 22, etc.) 20 and a mask stage 30, the displacement of a reference surface set to the absolute system or the like is treatable as zero (0). Additionally, in the present embodiment, one end surface of the stage 21 made of ceramics (the end surface on a side on which a differential interferometer 12 described later is disposed) is set as the reference surface (see FIG. 11).

The differential interferometer 12 is a device which analyzes interference fringes of light passed through different optical paths to measure a distance from a light source, and functions as a mask position measurement sensor which measures a position of a stencil mask 3 by use of the above absolute system (the reference surface thereof) as a reference. The differential interferometer 12 of the present embodiment irradiates both the reference surface and the stencil mask 3 with laser light, and analyzes reflected light to measure a relative distance between the surface and the mask (see FIG. 11). The distance between the reference surface and the stencil mask 3 which is measured in this manner is relative, and hence even when there is a change in the position of the differential interferometer 12, or the like due to the influence of the temperature change or the like, it is possible to detect the accurate position (the absolute position) of the stencil mask which is not influenced.

A roller mold position measurement sensor 13 is a sensor which measures the position of the roller mold 100 by use of the absolute system as a reference. In the present embodiment, a capacitance displacement meter (hereinafter, denoted with reference numeral 13) is used as the roller mold position measurement sensor 13, and the capacitance displacement meter 13 is attached to the ceramics stage 21, to measure the position of the roller mold 100 (see FIG. 11 and FIG. 12). In this case, axial positions of both end surfaces of the roller mold 100 in a rotary shaft direction are preferably measured. In the present embodiment, a pair of capacitance displacement meters 13a and 13b are arranged to face each other, and the positions of both the end surfaces of the roller mold 100 are measured, respectively (see FIG. 11). When the positions of both the end surfaces of the roller mold 100 are measured by the sensor of the absolute system (the capacitance displacement meter 13), it is possible to constantly measure the position of the roller mold 100 in the rotary shaft direction, and an expansion/contraction amount of the roller mold 100 in the rotary shaft direction.

As described up here, in the roller mold manufacturing device 1 of the present embodiment, a depiction position by electron beams is allowed to follow the axial direction displacement (the axial displacement) of the roller mold 100 synchronously with the displacement, and hence it is possible to suppress misalignment of an exposed position which is caused by rotational runout displacement of the roller mold 100. In consequence, it is possible to suppress a phenomenon where a depicted pattern becomes unclear owing to rotational runout of the roller mold 100 in the rotary shaft direction. Additionally, unlike a case where an aerostatic pressure bearing is used, enlargement or cost increase is not incurred.

Moreover, in a device which performs direct depiction on a resist with focused beams or the like, when misalignment occurs at a resist exposed position on the roller mold 100, the roller mold 100 itself is moved in an axial direction as needed to prevent the position misalignment, which can be one means. In contrast, in the roller mold manufacturing device 1 of the present embodiment, the comparatively heavy roller mold 100 is not moved, and the only stencil mask 3 lighter than this mold is moved to follow, so that a synchronous operation having excellent response and followability can be realized.

Figure 11:
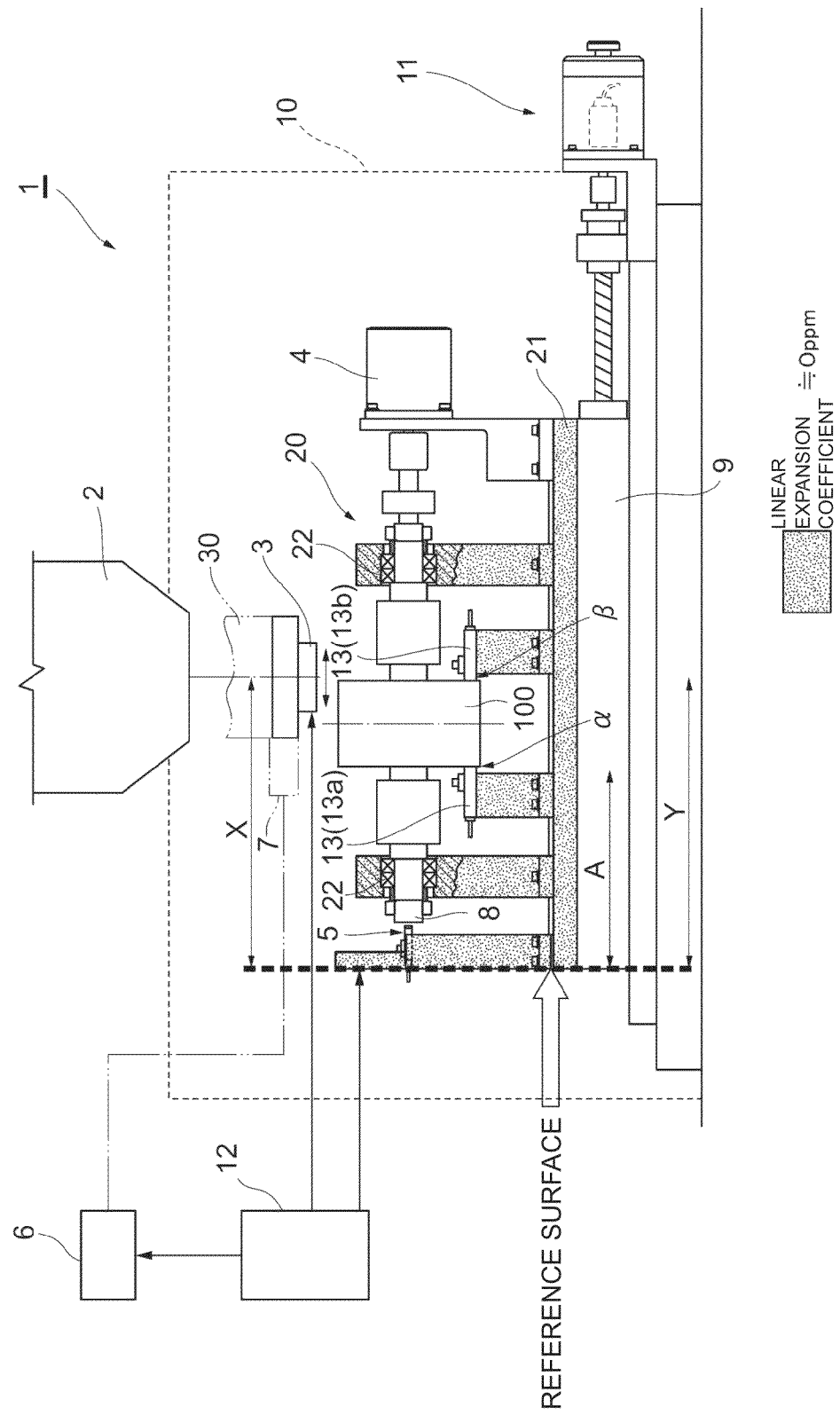
FIG. 11 is a view showing a constitution of a roller mold manufacturing device in one embodiment of the present invention.
Figure 12:
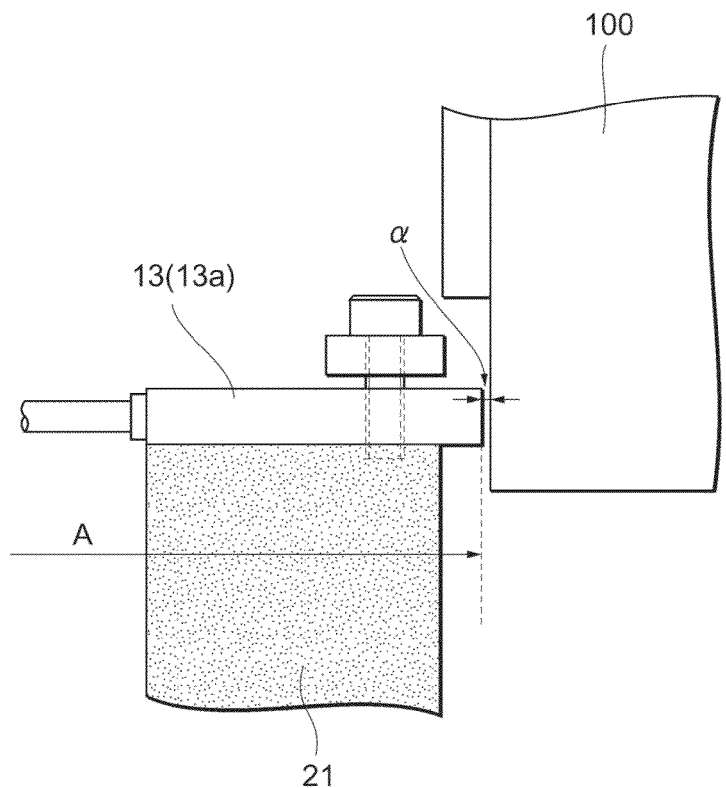
FIG. 12 is an enlarged view showing a constitution of a capacitance displacement meter and around the meter in FIG. 11.

Subsequently, there will be described a correction technique of the relative position misalignment caused by the temperature change during the manufacturing of the roller mold by use of the roller mold manufacturing device 1 (see FIG. 11, etc.).

In general, from the viewpoint of an electrostatic countermeasure of the electron beams, a metal is frequently used in a material of the roller mold 100. The metal material has a comparatively large linear expansion coefficient, and hence during pattern depiction with a size of several tens to several hundreds nanometers, or pattern depiction of about several nanometers in some cases, even when a temperature change of 0.01° C. level is present, the displacement or expansion/contraction of the roller mold 100 occurs, which might adversely affect a depiction precision. When the displacement or expansion/contraction further occurs in the roller support jig 20, the rotary shaft 8 and the mask stage 30 owing to the temperature change, the depiction precision is further influenced. In this respect, in the present embodiment, when the relative position misalignment due to the temperature change occurs, the position misalignment is corrected as follows.

First, as to the stencil mask 3, a distance (X1) from the above-mentioned reference surface to a predetermined portion (e.g., the center position) of the stencil mask 3 is measured by the differential interferometer 12 as needed. A measurement result (the measurement signal) of the differential interferometer 12 is transmitted to a control device 6 (see FIG. 11).

Moreover, as to the roller mold 100, positions of both end surfaces thereof are measured by the pair of capacitance displacement meters 13, respectively. In the present embodiment, the first capacitance displacement meter (the displacement meter closer to the differential interferometer 12) 13a measures the position of the end surface (hereinafter referred to also as "the roll reference end surface") of the roller mold 100 which is closer to the differential interferometer 12, and the second capacitance displacement meter 13b measures the position of the other end surface. The measurement results (the measurement signals) of the capacitance displacement meters 13a and 13b are transmitted to the control device 6.

Here, in the present embodiment,

X: the distance between the reference surface and the mask center (the depiction position);
A: the distance between the reference surface and the displacement meter; and
Y: the distance from the reference surface to the exposed position (see FIG. 11 and FIG. 12). The distance X can be measured by the differential interferometer. The distance A remains unchanged because the distance is not influenced by the temperature change.

Furthermore, in the present embodiment,

α: a measured value of the displacement meter (the distance from the front edge of the first capacitance displacement meter 13a to the one end surface (the roll reference end surface) of the roller mold 100);
β: a measured value of the displacement meter (the distance from the front edge of the second capacitance displacement meter 13b to the other end surface of the roller mold 100);
L: the roll surface length (the distance (the width) between the one end surface (the roll reference end surface) and the other end surface of the roller mold 100); and
P: the distance from the one end surface (the roll reference end surface) of the roller mold 100 to any exposed position. Suffix 1 is attached to each of these marks <when a position of the distance P from the roll reference end surface is exposed>, and suffix 2 is attached to the mark <after elapse of predetermined time> from the exposure, respectively.

<When the Position of the Distance P from the Roll Reference End Surface is Exposed (the Start of the Exposure)>

Figure 13:
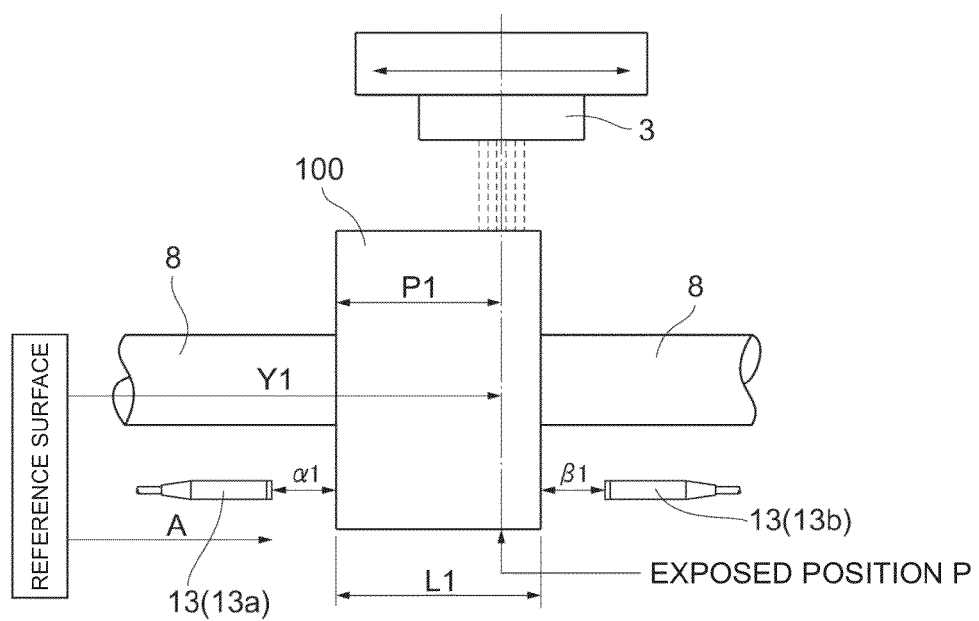
FIG. 13 is a view of the roller mold and the like showing that a position of a distance P from a roll reference end surface (the end surface closer to a differential interferometer of the roller mold) is exposed.

The measured values of the displacement meters are α1 and β1, the roll surface length is L1, and a distance from the roll reference end surface to any set position (the exposed position P) is P1 (see FIG. 13). At this time, a distance Y1 from the reference surface to the exposed position P is obtained by the following equation 1.

$$Y1 = A + \alpha 1 + P1 \qquad \text{[Equation 1]}$$

In this way, the distance Y (Y1) from the reference surface to the exposed position in an initial state can be obtained.

<After the Elapse of the Predetermined Time>

Figure 14:
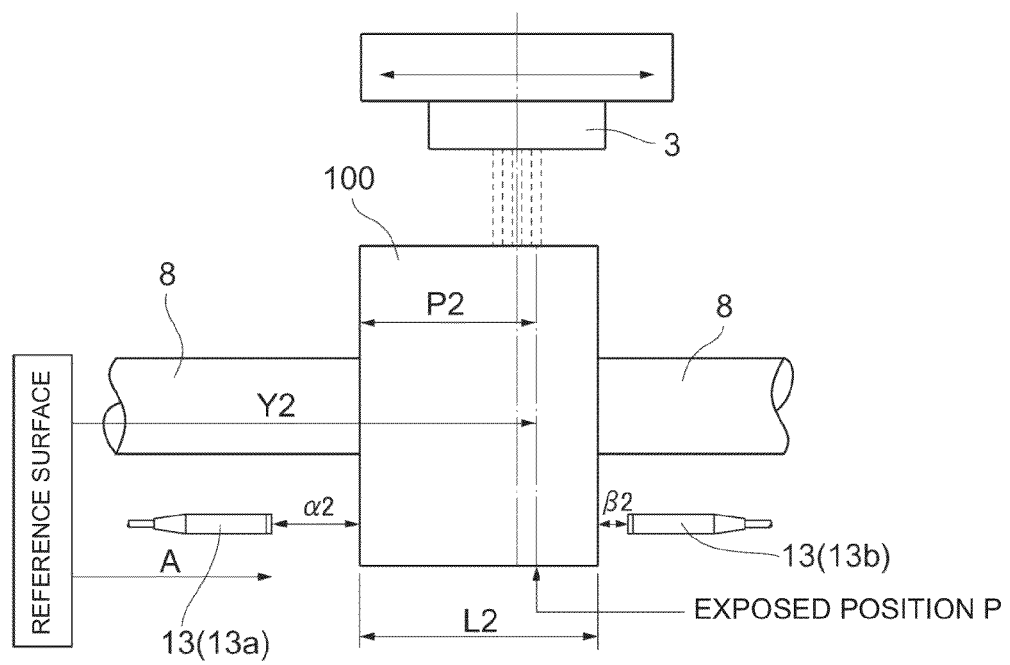
FIG. 14 is a view of the roller mold and the like showing that misalignment occurs between a center position of the stencil mask and a depiction position owing to an influence of deformation after elapse of predetermined time after the start of the exposure.

Hereinafter, there will be described a correction technique of relative position misalignment when the roller mold (including the rotary shaft 8) 100 is axially deformed after the elapse of the predetermined time with respect to one example (see FIG. 14). When the end surface of the rotary shaft 8 comes in contact with, for example, a rotation driving motor 4 and the rotary shaft 8 elongates with a temperature rise, the position of the roller mold 100 supported by the rotary shaft 8 is displaced.

Here, a distance P2 from the roll reference end surface to the exposed position P after the deformation of the roller mold 100 is obtained. For this purpose, first a deformation amount L2−L1 of the roller mold 100 is obtained by the following equation 2.

$$L2-L1 = -\{(\alpha 2 - \alpha 1) + (\beta 2 - \beta 1)\}$$

It is considered that the deformation amount of the roller mold 100 is uniform in the roll surface length, and hence P2 is obtained by proportional distribution as follows.

$$P2 = P1 + (L2 - L1) \times (P1/L1) \quad \text{[Equation 3]}$$
$$= P1 - \{(\alpha 2 - \alpha 1) + (\beta 2 - \beta 1)\} \times (P1/L1)$$

Therefore, the distance Y2 from the reference surface to the exposed position P after the deformation is obtained by the following equation 4.

$$Y2 = A + \alpha 2 + P2 \quad \text{[Equation 4]}$$
$$= A + \alpha 2 + P1 - \{(\alpha 2 - \alpha 1) + (\beta 2 - \beta 1)\} \times (P1/L1)$$

Here, a difference between the distance from the reference surface to the exposed position P before the deformation and the distance after the deformation is obtained by the following equation 5.

$$Y2 - Y1 = A + \alpha 2 + P1 - \{(\alpha 2 - \alpha 1) + (\beta 2 - \beta 1)\} \times \quad \text{[Equation 5]}$$
$$(P1/L1) - (A + \alpha 1 + P1)$$
$$= (\alpha 2 - \alpha 1) - \{(\alpha 2 - \alpha 1) + (\beta 2 - \beta 1)\} \times (P1/L1)$$

Each numeric value in the right side (the last) of the above equation 5 is a known or measurable value, and hence (Y2−Y1) can be obtained by calculation. In consequence, when the stencil mask 3 is moved as much as (Y2−Y1) obtained from the equation 5, a relation of X=Y can be maintained. Therefore, even when the deformation (e.g., the thermal deformation) occurs in the roller mold 100 or the like, the exposure is possible without changing the relative positions of the exposed position P and (the center of) the stencil mask 3.

Additionally, the distances α and β include errors under the influence of the state of the surface of the roller mold 100, and hence the distances are preferably measured in a state where such an influence is eliminated as much as possible. For example, in the present embodiment, the control device 6 calculates an average value (the time average) of the measurement results while the roller mold 100 rotates several times, and a change amount is judged based on the average value.

Moreover, there are various calculation methods of the average value (the time average) within predetermined time, and an example where an average value of measurement data for the most recent predetermined time is obtained while updating the data every comparatively short time is one preferable example. Specific examples of the method include a technique where the measurement data for the most recent ten minutes is updated every minute (i.e., the oldest measurement data for one minute is replaced with the latest data for one minute) to obtain the average value.

As described up here, in the roller mold manufacturing device 1 of the present embodiment, the displacement amount is measured with each measurement sensor (the differential interferometer 12 or the capacitance displacement meter 13) by use of the absolute system (treatable as a system) in which there is not any displacement accompanying a minor temperature change, as a reference, whereby the positions (the absolute positions) of the stencil mask 3 and the roller mold 100 in the absolute system are grasped, the relative position misalignment amount is constantly accurately calculated, and the stencil mask 3 is driven in accordance with the misalignment amount. According to this constitution, the misalignment of the relative positions of the stencil mask 3 and the roller mold 100 is corrected so as to be minimized, and it is possible to avoid a phenomenon where the depicted pattern becomes unclear owing to the influence of the temperature change.

It is to be noted that the above-mentioned embodiment is one example of a preferable mode for carrying out the present invention, but the present invention is not limited to this embodiment, and can variously be modified without departing from the scope of the present invention. For example, in the present embodiment, to correct the position misalignment, the stencil mask 3 is moved in the axial direction. Conversely, also when the roller mold 100 is moved in the axial direction, the position misalignment can be corrected. However, when the stencil mask 3 is made of a low specific gravity material such as silicon, a response can be enhanced more by moving the comparatively light weight stencil mask 3 than by moving the roller mold 100.

EXAMPLE 1

An exposure test was conducted by using the roller mold manufacturing device 1 described above. Hereinafter, the results will be described as an example.

Figure 15:
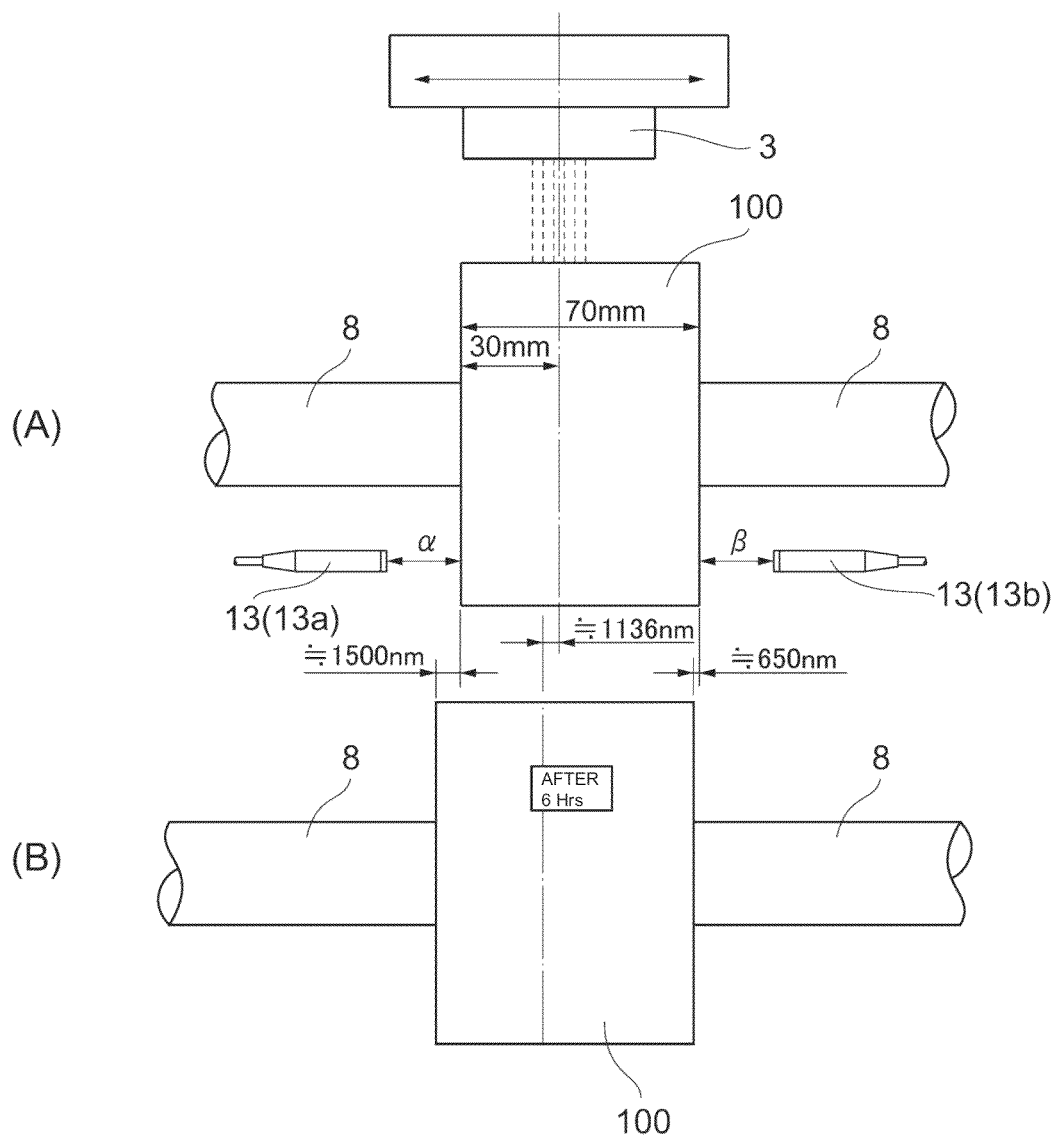
FIG. 15 is a view showing a roller mold, a stencil mask and the like in an example of the present invention.

In this exposure test, while rotating the roller mold 100 about 4000 times for about six hours, it was tested whether or not misalignment occurred in an exposed position owing to the influence of thermal deformation or the like. The used stencil mask 3 has an opening dimension including an opening width of 200 nm and an exposure pitch of 2000 nm. Roll conditions (the exposed position, and a roll surface length) during the exposure test were as shown in FIG. 15.

Figure 16:
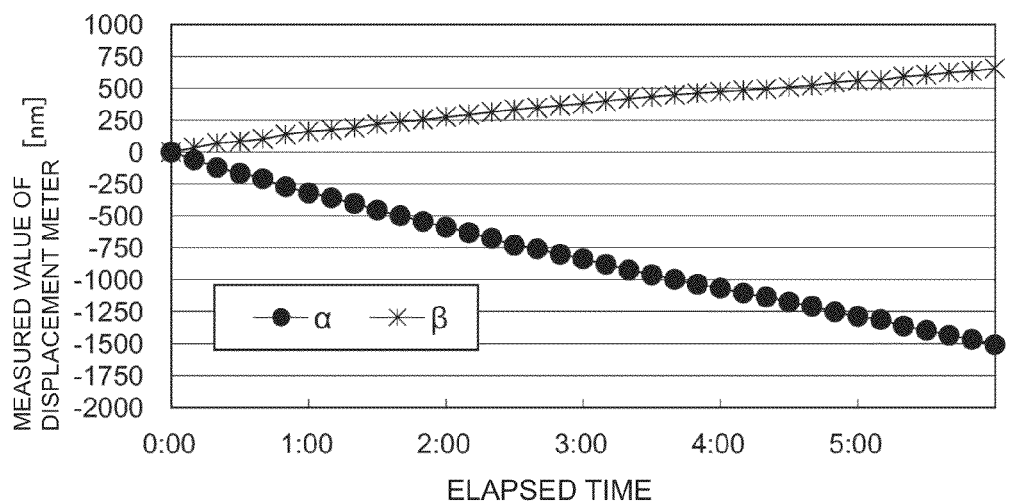
FIG. 16 is a graph showing measurement results of measured values $\alpha$ and $\beta$ of the displacement meter until six hours elapse from the start of an exposure test.

There were checked changes of a displacement meter measured value α (the distance from the front edge of the first capacitance displacement meter 13a to one end surface (the roll reference end surface) of the roller mold 100), and a displacement meter measured value β (the distance from the front edge of the second capacitance displacement meter 13b to the other end surface of the roller mold 100) until six hours elapsed from the start of the test while an exposure start time point was regarded as 0 (see FIG. 16). Also in consideration of this result, it has been considered that various position misalignments occur owing to thermal deformation with the elapse of time. Additionally, an estimated misalignment amount of the exposed position where any control was not performed was 1136 nm (see FIG. 15).

Figure 17:
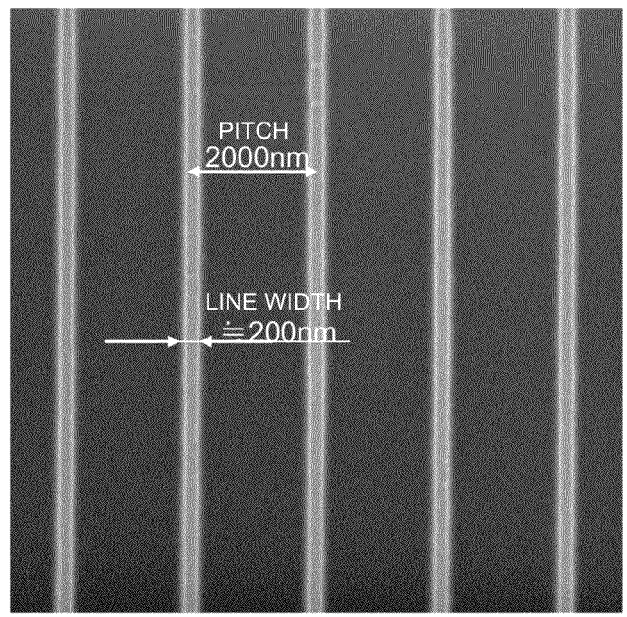
FIG. 17 is an SEM image showing one example after development of an exposed portion of the roller mold.

When the position control of the stencil mask 3 was performed based on a temperature correction control technique, it was possible to depict a line having a line width of about 200 nm while the opening width of the stencil mask 3 was 200 nm (see FIG. 17). It has been confirmed from this result that the exposure was possible by minimizing the relative misalignment between the exposed position and the position of the stencil mask 3.

INDUSTRIAL APPLICABILITY

The present invention is suitably applied to a manufacturing device of a roller mold which is a roller-like die to transfer a pattern and a manufacturing method of the same.

DESCRIPTION OF REFERENCE NUMERALS

1 ... roller mold manufacturing device, 2 ... electron beam irradiation device, 3 ... stencil mask (the mask), 4 ... rotation driving motor (the rotation drive device), 5 ... displacement amount detection sensor, 6 ... control device, 7 ... actuator, 8 ... rotary shaft, 12 ... differential interferometer (the mask position measurement sensor), 13 ... capacitance displacement meter (the roller mold position measurement sensor), 20 ... roller support jig, 21 ... stage (the absolute system), 30 ... mask stage, and 100 ... roller mold.

The invention claimed is:

1. A manufacturing device of a roller mold which is a roller-like die to transfer a pattern, comprising:
    an electron beam irradiation device which irradiates, with electron beams, the roller mold coated with a resist;
    a mask which has an opening that allows passage of some of electron beams emitted from the electron beam irradiation device, and which forms a plurality of beams that perform simultaneous depiction on the resist;
    a rotation drive device which rotates the roller mold around a rotary shaft;
    a displacement amount detection sensor which detects a rotational runout displacement amount of the roller mold in the direction of the rotary shaft at the rotation by the rotation drive device;
    a control device which receives a detection signal from the displacement amount detection sensor, and transmits a control signal to allow a depiction position on the resist of the roller mold by the electron beams to follow the roller mold; and
    an actuator which, based on the control signal from the control device, allows the depiction position by the electron beams to follow the displacement of the roller mold in the direction of the rotary shaft,
    wherein misalignment of an exposed position of the resist, which is caused by rotational runout displacement of the roller mold in the direction of the rotary shaft, is suppressed.

2. The manufacturing device of the roller mold according to claim 1,
    wherein the opening of the mask forms the passed electron beams into a plurality of parallel beams.

3. The manufacturing device of the roller mold according to claim 1,
    wherein the actuator moves the mask in the rotary shaft direction.

4. The manufacturing device of the roller mold according to claim 1,
    wherein the displacement amount detection sensor detects the displacement amount of an end surface of the rotary shaft in the rotary shaft direction.

5. The manufacturing device of the roller mold according to claim 1,
    wherein the displacement amount detection sensor detects the displacement amount of a rotation center portion of the end surface of the rotary shaft.

6. The manufacturing device of the roller mold according to any one of claims 1 to 5,
    wherein the actuator is a piezoelectric actuator.

7. A manufacturing method of a roller mold which is a roller-like die to transfer a pattern, comprising:
    allowing passage of electron beams emitted from an electron beam irradiation device through a mask provided with an opening to form a plurality of beams which perform simultaneous depiction on a resist;
    rotating the roller mold coated with the resist around a rotary shaft, and irradiating the roller mold with the electron beams passed through the mask;
    detecting a rotational runout displacement amount of the roller mold in the rotary shaft direction at the rotation; and
    allowing a depiction position on the resist of the roller mold by the electron beams to follow the roller mold based on the detection signal.

8. The manufacturing method of the roller mold according to claim 7,
    wherein the electron beams passed through the opening of the mask are formed into a plurality of parallel beams.

9. The manufacturing method of the roller mold according to claim 7,
    wherein an actuator moves the mask in the rotary shaft direction, and allows the depiction position on the resist of the roller mold by the electron beams to follow the roller mold.

10. The manufacturing method of the roller mold according to claim 7,
    wherein a displacement amount of an end surface of the rotary shaft in the rotary shaft direction is detected to detect the rotational runout displacement amount of the roller mold in the rotary shaft direction.

11. The manufacturing method of the roller mold according to claim 10,
    wherein a displacement amount of a rotation center portion of the end surface of the rotary shaft is detected.

12. The manufacturing device of the roller mold according to claim 1, further comprising:
    an absolute system treatable as a system which is not influenced by a temperature change;
    a mask position measurement sensor which measures a position of the mask by use of the absolute system as a reference; and
    a roller mold position measurement sensor which measures a position of the roller mold by use of the absolute system as a reference,
    wherein the control device receives measurement signals from the roller mold position measurement sensor and the mask position measurement sensor, and transmits a control signal to minimize misalignment of the depicted pattern on the resist of the roller mold by the electron beams, and
    the actuator moves at least one of the roller mold and the mask based on the control signal from the control device, and moves the depiction position by the electron beams.

13. The manufacturing method of the roller mold according to claim 7, further comprising:
    measuring a position of the roller mold by use of an absolute system treatable as a system which is not influenced by a temperature change, as a reference;
    measuring a position of the mask further by use of the absolute system as a reference;
    detecting a relative misalignment amount based on a difference between the position of the roller mold or the position of the mask and the absolute system, when a relative position misalignment between the roller mold and the mask occurs; and moving at least one of the roller mold and the mask to minimize the misalignment of the depicted pattern on the resist of the roller mold by the electron beams.

14. A manufacturing method of a roller mold which is a roller-like die to transfer a pattern, comprising:

measuring a position of the roller mold by use of an absolute system treatable as a system which is not influenced by a temperature change, as a reference;

measuring a position of a mask which allows passage of some of electron beams emitted from an electron beam irradiation device, further by use of the absolute system as a reference;

detecting a relative misalignment amount based on a difference between the position of the roller mold or the position of the mask and the absolute system, when a relative position misalignment between the roller mold and the mask occurs; and moving at least one of the roller mold and the mask to minimize the misalignment of a depiction position on the resist of the roller mold by the electron beams.

15. A manufacturing device of a roller mold which is a roller-like die to transfer a pattern, comprising:

an electron beam irradiation device which irradiates the roller mold coated with a resist with electron beams;

a mask which has an opening that allows passage of some of the electron beams emitted from the electron beam irradiation device, and which forms a plurality of beams that perform simultaneous depiction on the resist;

a roller support jig which supports the roller mold;

a rotation drive device which rotates the roller mold around a rotary shaft;

an absolute system treatable as a system which is not influenced by a temperature change;

a mask position measurement sensor which measures a position of the mask by use of the absolute system as a reference;

a roller mold position measurement sensor which measures a position of the roller mold by use of the absolute system as a reference;

a control device which receives measurement signals from the roller mold position measurement sensor and the mask position measurement sensor, and transmits a control signal to minimize misalignment of a depiction position on the resist of the roller mold by the electron beams; and an actuator which moves at least one of the roller mold and the mask based on the control signal from the control device, and moves the depiction position by the electron beams.

\* \* \* \* \*